US011506696B2

(12) United States Patent
Lucky et al.

(10) Patent No.: US 11,506,696 B2
(45) Date of Patent: Nov. 22, 2022

(54) HOLD-UP CAPACITANCE HEALTH MEASUREMENT WITH CURRENT LEAKAGE DETECTION

(71) Applicant: WESTERN DIGITAL TECHNOLOGIES, INC., San Jose, CA (US)

(72) Inventors: Richard S. Lucky, Louisville, CO (US); Brian Hadley Robinson, San Pedro, CA (US); Andrew David Prosory, Queen Creek, AZ (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 80 days.

(21) Appl. No.: 17/180,651

(22) Filed: Feb. 19, 2021

(65) Prior Publication Data
US 2022/0122631 A1    Apr. 21, 2022

Related U.S. Application Data

(60) Provisional application No. 63/092,155, filed on Oct. 15, 2020.

(51) Int. Cl.
*G01R 27/26* (2006.01)
*G01R 27/00* (2006.01)
(Continued)

(52) U.S. Cl.
CPC ......... *G01R 27/2605* (2013.01); *G01R 27/00* (2013.01); *G01R 31/64* (2020.01); *G06F 11/073* (2013.01); *G11B 5/3189* (2013.01)

(58) Field of Classification Search
CPC ........ G01R 27/00; G01R 27/02; G01R 27/08; G01R 27/26; G01R 27/2605; G01R 31/00;
(Continued)

(56) References Cited

U.S. PATENT DOCUMENTS 4,243,933 A * 1/1981 Rollman ............ G01R 27/2605
324/677
5,608,333 A * 3/1997 Hayashi ............... G01R 17/105
324/705
(Continued)

FOREIGN PATENT DOCUMENTS

CN    103543367 A  *  1/2014    ........... G01R 31/028
FR      2896883 A1  *  8/2007    ............ B60L 3/0023
(Continued)

OTHER PUBLICATIONS

Wu, "A Ven Condition Monitoring Method of DC-Link Capacitors for Power Converters," IEEE Transactions on Industrial Electronics, vol. 66, No. 2, 2019.
(Continued)

*Primary Examiner* — Hoai-An D. Nguyen
(74) *Attorney, Agent, or Firm* — ArentFox Schiff LLP

(57) ABSTRACT

Circuits for measuring a leakage current of one or more capacitors coupled to a power supply line that powers an apparatus, such as a storage device, are disclosed. In one embodiment, the circuit includes first and second resistors between the power supply line, and first and second respective switches to ground. A controller may charge the voltage line to a first voltage. Thereafter, the controller discharges the first voltage to a second voltage via the first resistor during a first identified time. After recharging the voltage line, the controller then discharge the first voltage to the second voltage via at least the second resistor during a second identified time. The controller determines the parasitic resistance using the first and second identified times, and then the leakage current from the parasitic resistance.
(Continued)

Removing the leakage current factor from subsequent measurements can greatly improve testing accuracy and can avoid false positives in the testing process that would otherwise require removal of drives or other systems that are working properly.

20 Claims, 12 Drawing Sheets

(51) Int. Cl.
  *G01R 31/64* (2020.01)
  *G06F 11/07* (2006.01)
  *G11B 5/31* (2006.01)
  *G11B 5/49* (2006.01)

(58) Field of Classification Search
  CPC ........ G01R 31/50; G01R 31/52; G01R 31/64; G06F 11/00; G06F 11/07; G06F 11/0703; G06F 11/0706; G06F 11/073; G06F 11/22; G06F 11/2205; G06F 11/2273; G11B 5/00; G11B 5/127; G11B 5/31; G11B 5/3109; G11B 5/312; G11B 5/3189; G11B 5/48; G11B 5/49; G11B 5/4969; G11B 5/4984; G11C 29/00; G11C 29/04; G11C 29/50; G11C 2029/5004
  USPC ........................................ 324/500, 537, 548
  See application file for complete search history.

(56) References Cited

U.S. PATENT DOCUMENTS

2019/0101585 A1* 4/2019 Marques Martins ........................ H01L 29/7848
2022/0262574 A1* 8/2022 Sakaguchi ............ H01G 9/151

FOREIGN PATENT DOCUMENTS

JP        H09193437 A  *  7/1997  ............. G01R 27/02
KR     20090024573 A  *  3/2009  ............. G01R 31/36

OTHER PUBLICATIONS

Request for the Submission of an Opinion dated Sep. 15, 2022 in Korean Patent Application No. 10-2021-0081783.

* cited by examiner

HOLD-UP CAPACITANCE HEALTH MEASUREMENT WITH CURRENT LEAKAGE DETECTION

CROSS-REFERENCE TO RELATED APPLICATION

This application claims the benefit of, and right of priority to, U.S. Provisional Patent Application No. 63/092,155, entitled "Hold-Up Capacitance Health Measurement With Current Leakage Detection," filed on Oct. 15, 2020, the entire contents of which are herein incorporated by reference as if fully set forth herein.

BACKGROUND

Field

This disclosure is generally related to electronic devices and more particularly to energy leakage detection in hold-up capacitors.

Background

Capacitors are often connected to a voltage source or supply node to protect, in the event of a power failure, the integrity of data being exchanged over a circuit that receives power from the supply node. One example of such circuits includes non-volatile memory (NVM), such as solid state disc drives, for example. After receiving multiple write requests from a host device, but prior to completing all write operations, the drive may experience a power failure. In that event, the hold-up capacitor(s) may help maintain enough energy at the supply node for just long enough to enable the drive to complete all pending write operations before device failure.

These hold-up capacitors may undergo periodic "health" tests to ensure that they can maintain this necessary hold-up energy for a specified duration during power-off events. Health tests may use firmware to measure a leakage current through the capacitors that, if exceeded, render a perception of insufficient performance and thus a "failed" drive. The leakage current in these cases may be perceived as deficient if its magnitude is sufficiently high relative to a typical operating current through a standard load resistor of the drive, as one example.

In many cases, however, the same leakage current that produces a failed test may still enable hold-up capacitors to perform correctly under the same threshold conditions in an actual power failure, meaning the test in these cases is wrongly predicting failures. These "false positives" occur due to the small magnitude of the leakage current as compared to the large current needed to sustain the drive energy. Stated differently, these tests often result in failure even where the same hold-up capacitors can function perfectly well in a power drain event. Reconfiguring the drive or removing a perfectly good drive from service in these situations is costly and unnecessary.

SUMMARY

One aspect of a circuit is disclosed herein. The circuit includes a capacitor between a voltage line and ground and having a parasitic resistance. The circuit also includes first and second resistors between the voltage line and first and second respective switches to the ground. The circuit further includes a controller. The controller is configured to charge the voltage line to a first voltage. Thereupon, the controller is configured to discharge the first voltage to a second voltage via the first resistor during a first identified time. Upon recharging the voltage line to the first voltage, the controller is then configured to discharge the first voltage to the second voltage via at least the second resistor during a second identified time. The controller is configured to determine the parasitic resistance using the first and second identified times.

Another aspect of a circuit is disclosed herein. The circuit includes a capacitor between a voltage line and ground and having a parasitic resistance. The circuit further includes a first resistor between the voltage line and a first switch to the ground. The circuit includes a second resistor between the first switch and a second switch to the ground. The circuit further includes a controller. The controller is coupled to the voltage line and configured to charge the voltage line to a first voltage. The controller is further configured to discharge the first voltage to a second voltage via the first resistor during a first identified time. After recharging the voltage line to a first voltage, the controller is configured to discharge the first voltage to the second voltage via the first and second resistors during a second identified time. The controller is then configured to determine the parasitic resistance using the first and second identified times.

Still another aspect of a circuit is disclosed herein. The circuit includes a capacitor between a voltage line and ground and having a parasitic current sink ($pi_s$). The circuit also includes first and second current sinks ($i_s$) between the voltage line and first and second respective switches to the ground. The controller is configured to charge the voltage line to a first voltage. The controller is then configured to discharge the first voltage to a second voltage via the first is during a first identified time. After recharging the voltage line to the first voltage, the controller is configured to discharge the first voltage to the second voltage via at least the second $i_s$ during a second identified time. The circuit is configured to determine a current through $pi_s$ the using the first and second identified times.

It is understood that other aspects of the storage device and method will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1A:
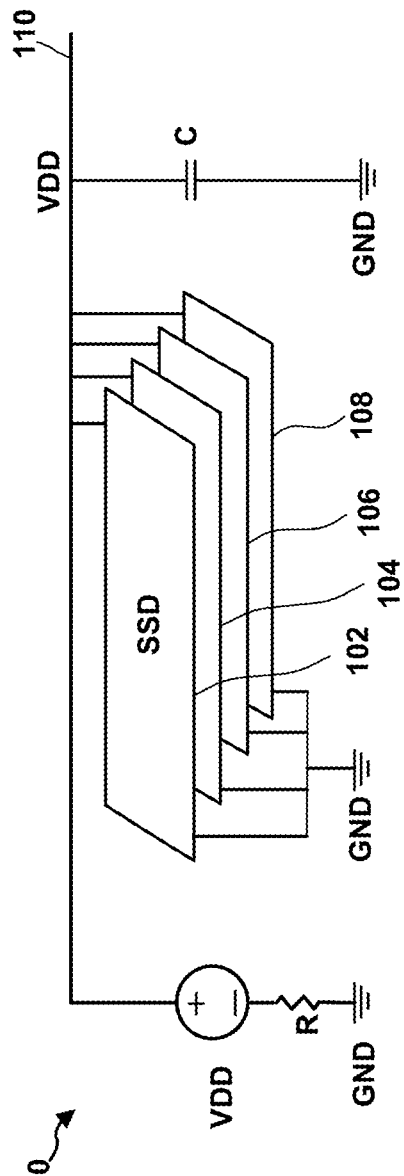
FIG. 1A is a block diagram illustrating an exemplary embodiment of a hold-up capacitor between a VDD supply node and ground and a plurality of (solid-state drive) SSD drives between VDD and ground.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

The principles of this disclosure may be implemented by different types of controllers that may be coupled to the test circuits described herein. These controllers and their components may be implemented using electronic hardware, computer software, or any combination thereof.

By way of example, an element, component, or any combination thereof of a controller may be implemented using one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. The one or more processors may be part of a workstation or a server computer configured to perform the routines described herein. The one or more processors may execute software and firmware. Software and firmware shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, object code source code, or otherwise.

Accordingly, in one or more example embodiments, the functions described may be implemented in hardware, software, or any combination thereof. If implemented in software, the functions may be stored on or encoded as one or more instructions or code on a computer-readable medium.

The present disclosure is directed to capacitor-based circuits that are used to protect data in devices when power fails. For the purpose of this disclosure, the term capacitor shall include within its scope one or more capacitors unless otherwise stated. Thus, for example, a capacitor as referred to herein, and often (but not necessarily) denoted as "C" may describe any number including a single capacitor, a few capacitors, a capacitor bank, etc. Where a capacitor is positioned between two nodes under this definition, the net capacitance is understood as routinely used and known by practitioners in the art, e.g. as it may be computed in parallel or series by those skilled in the art without the need herein for a further configuration information of the capacitor that may include plural elements between two nodes. In one set of embodiments, the capacitor may be positioned between a power supply node (e.g., 5 volts, 28 volts, etc., depending on the nature of the circuit and power needs) and a ground. In other embodiments, however, the power supply may be connected to a voltage node other than a supply or ground node. For the purpose of this disclosure, a circuit or plurality thereof is also coupled to the power supply (directly or indirectly), e.g., for performing data transactions. While the circuit at issue need not be a particular type of circuit, in one embodiment an enterprise solid state power supply is used. The capacitance value of the capacitor (or bank thereof) is selected based on the needs of the circuits that are attached as well as the value of the supply voltage.

The circuit may be in the process of exchanging data, for example. After the time the circuit has begun the data exchange but prior to completion of the change, the supply node may experience a sudden power glitch or an outright power failure. In these circumstances, it is desirable to complete each of the data transactions that were initiated prior to loss of power at the circuit. For example, in one embodiment, the circuit may be one or more enterprise-class solid-state storage drives for backing up data. During the course of normal operation, one of the drives may receive write requests from a host device. After acknowledging the requests, but prior to completing the actual data writes, it is assumed that a sudden power loss is experienced such that the supply node is no longer provided power. It is for this reason that the capacitor is coupled between supply and ground. The capacitor is configured to slow down the discharge of energy at the supply node so that, prior to the time the node loses a threshold power amount that would render the drive inoperable, the drive has enough time to complete the outstanding writes. After that time, when the writes are complete and the integrity of the data is preserved, the device may power down until power is once again restored.

In this example, if the capacitor were not present or the value of its capacitance (or net capacitance for more than one capacitor) was insufficient, the data would be lost. Thus if the capacitor's performance degraded over time, eventually it would no longer be effective at maintaining the energy of the supply node at a sufficient magnitude to enable the writes to complete.

For this reason, a periodic "health" test of the capacitor may be performed over time to ensure that the capacitor is functioning properly. In the example of the storage drive, provided the capacitor passes the periodic heath tests, the drive will continue to be able to ensure proper writes even in the event of a power outage. By contrast, a failed test would likely mean that the drive can no longer guarantee completion of writes in the event of power failure. At best, the data on the drive could be "read only".

The premise of this type of health test is that, by partially discharging the capacitor (bank) through a known resistance, the time can be measured to reach a set voltage. Thereupon, the supply node can be recharged and the capacitor can be partially charged again, but this time under a different load for reasons that will become apparent below. Accordingly, in one embodiment a firmware routine can start a health test by initiating the discharge and monitoring the time taken by the capacitor to decay to a specified voltage. This time can generally be set to be greater than some specified threshold. Otherwise, in the case of the storage devices, host writes are terminated and an error is reported. Generally, this discharge technique should ensure through relevant calculations the capacitor is capable of maintaining some necessary energy threshold for a specified time to ensure data integrity in an energy outage event.

One potential problem with this technique is that capacitor leakage current varies with temperature, component age, population of components, and capacitor type. Particularly at the wrong edges of the process corners, the parasitic resistance of each capacitor can draw enough current to alter the discharge test results by significantly increasing the discharge rate. The time to discharge is thereby reduced, and the hold-up energy available in this event can be substantially underestimated. This underestimation can result in erroneous test failures, or false positives, meaning in some cases that the drive is deemed outright inoperable or defective, and potentially removed from service. Each of these outcomes are, to say the least, suboptimal.

The leakage current discussed above is ordinarily not a problem during a discharge test because, more often than not, its magnitude is similar to that of the current draining through the set load resistance of the circuit in normal operation. That is to say, leakage current is often not a problem during an input power failure because the magnitude of the leakage current is proportionately very small in comparison to the large drive energy needed to hold-up the node properly, and hence the large magnitude of the current that would be needed to prematurely discharge the node. However, the nature of the discharge test in many circumstances is that it uses a minimum energy draw. This is because using a minimum energy draw means that the circuit (e.g., the drive) served by the capacitor bank can continue to be available and operating even during health-testing. However, because the inventors have determined that the capacitor leakage current can be a large percentage compared to the measured drain through the set load resistors during normal operation, but only a small percentage of the total current drawn at the onset of an actual power outage, the test as currently configured by many manufacturers may not produce an accurate result.

Accordingly, in one aspect of the disclosure, techniques are disclosed to increase the accuracy of the hold-up measurements by detecting and accounting for the leakage resistance of the capacitor. Instead of performing a single discharge and taking measurements, for example, the technique described herein combines results from multiple capacitor discharge tests to remove the common leakage current component through the net parasitic resistance of the capacitor bank. In various embodiments, each discharge test is run with different drain resistors. These multiple measurements can be combined mathematically as shown herein to nullify the effect of the capacitor leakage otherwise present in each individual test.

FIG. 1A is a block diagram 100 illustrating an exemplary embodiment of a hold-up capacitor 100 between a VDD supply node and ground and a plurality of (solid-state drive) SSD drives between VDD and ground. FIG. 1A is intended to provide an overview of an exemplary circuit in which the embodiments herein may be found. A power source VDD may power a node 110 which in this example acts as the supply node. A lead resistor R is also shown as a load resistor under normal operation. Four SSD drive circuit boards 102, 104, 106 and 108 are shown between VDD and ground (GND). Each of the circuit boards may include a plurality of storage drives. In actual operation, there may be intervening circuit elements between node 110 and the SSD boards. Finally, capacitor C is the capacitor or bank of capacitors that act as the hold-up device. Where capacitor C is in actuality a plurality of capacitors in series, in parallel or in both configurations, the bank will have a net parasitic resistance parallel with the capacitor bank and through that parasitic resistance will flow a net leakage current.

Figure 1B:
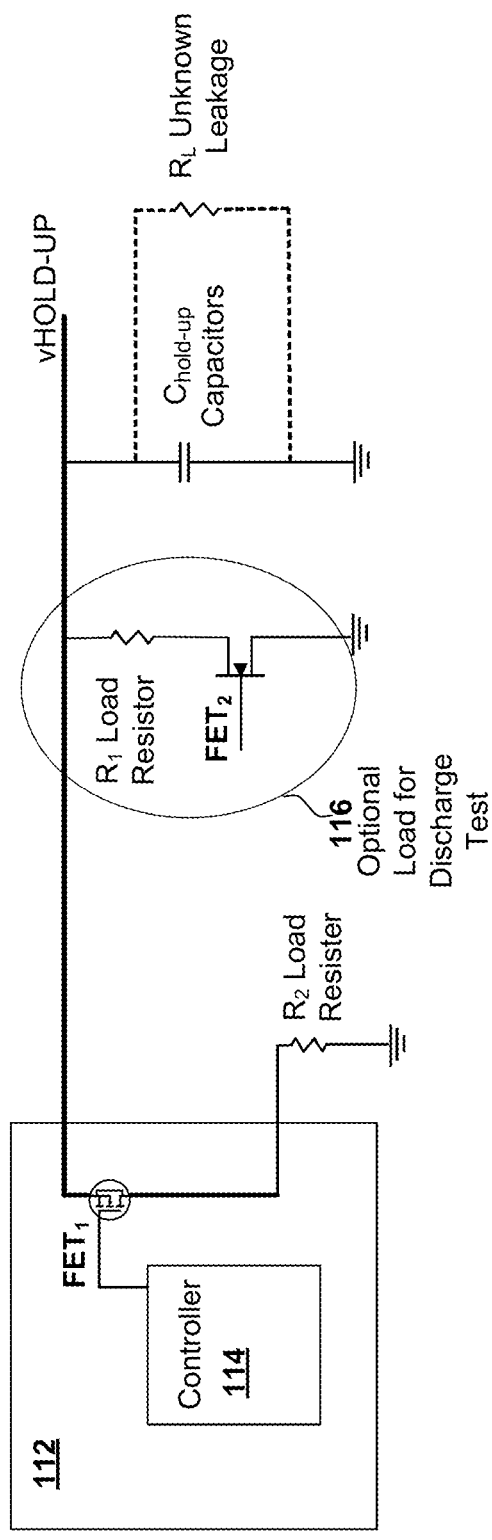
FIG. 1B is a block diagram of a circuit for testing the hold-up capacitor in the circuit of FIG. 1B.

FIG. 1B is a block diagram of a circuit 110 for testing the hold-up capacitor(s) $C_{holdup}$ in the circuit of FIG. 1B. In the embodiment shown, $R_2$ is a load resistor similar to R of FIG. 1A. Module 112 is a removable controller that in this embodiment may be used for test purposes, such as to control the voltage at vHOLD-UP and to control the switches FET1 and FET2, where it is assumed that the switches here are MOSFET transistors. The elliptical area 116 represents an optional load including an optional transistor and resistor for use during the circuit discharge test, as shown in greater detail with reference to figures below. The parasitic resistance $R_L$ is not an actual physical resistor but has a value that is in parallel with the hold-up capacitors. It is also noted that, while the controller 114 is not shown as being connected to the load resistor $R_1$, it is assumed in this example that the controller 114 controls both FETS. After using the FETs to charge the capacitor, the controller can selectively discharge the capacitor through $R_1$ and separately, through $R_2$ and can record the discharge time through each. The leakage resistance is in parallel to the known load resistance, but the leakage resistance is common in both tests. It is also noted that, with reference to $FET_1$, a diode runs between the gate and source, and the gate is tied to the drain to enable the controller to set VHoldup at any desired voltage, such as VDD.

Controller 114 and/or module 112 may be an external controller that can be used on the fly, in which case it may be removable (e.g., a "hotswap" controller or the like). In other embodiments controller 114 and/or module 112 may be an integrated part of the circuit structure. In addition, controller 114 may be part of the flash controller. In other embodiments, portions of the functionality of the controller 114 may be incorporated into the device (e.g., as part of one of the circuit boards) and other portions may be attachable and/or removable. In still other embodiments, controller 114 may be an external controller coupled to some external device that is connected to the FETs. Controller 114 may also include one or more processors and memory for performing calculations and making time and other measurements relevant to the hold-up tests. Module 112 and/or controller 114 may also have networking capabilities and may be controllable from another location. Controller 114 may also be able to make pass and fail determinations as necessary.

Controller 114 may also be configured to charge and discharge the capacitor $C_{holdup}$. Thus, by way of example, when $FET_1$ and $FET_2$ are turned off and on, respectively, to discharge the capacitive load through R1, the total load resistance of the circuit is Ra=R1∥RL (where the "a" signifies test run a). Similarly, after the capacitor is re-charged, and when $FET_1$ and $FET_2$ are turned on and off, respectively, to discharge the capacitive load through $R_2$, the total load resistance of the circuit is Rb=$R_2$∥$R_L$.

Generally for a capacitor discharge from voltages V1 to V2, the discharge time can be calculated for both cases with the well-known formula:

$T1=(Ra)(C)\ln(V1/V2)$ and $T2=(Rb)(C)\ln(V1/V2)$.

Solving for (C)ln(V1/V2)=T1/Ra=T2/Rb since the quantity (C)ln(V2/V2) can be maintained constant.

Solving for the leakage resistance yields:

$R_L=(T1-T2)/((T2/R2)-((R1-R2)/R1))$

Thus, in one embodiment, the calculated leakage resistance ($R_L$) may then be used to alter the discharge time threshold that corresponds to a capacitance range. It is also noted that the leakage current calculation is straightforward once $R_L$ is known.

The general description above can be extended to a variety of ways to use the identified formula to compute the parasitic resistance of the capacitor bank, as well as the leakage current, after which the discharge time threshold for a given capacitance range can be set in a manner such that capacitor banks that can maintain the desired energy at the supply node for the necessary time no longer are determined to result in 'false positives'.

Figure 2:
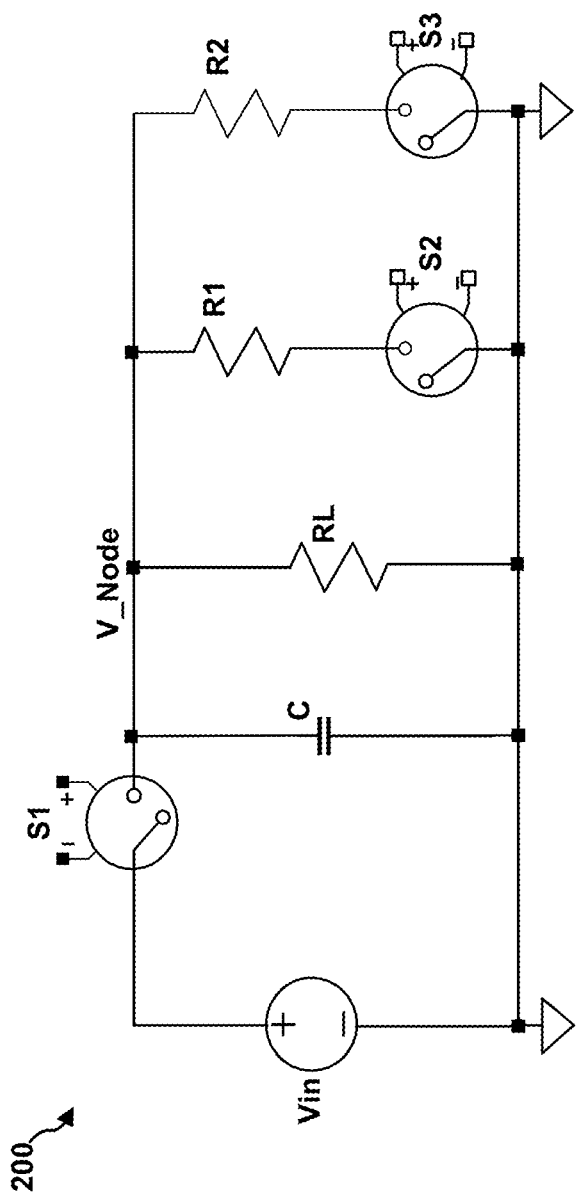
FIG. 2 is a circuit diagram of a capacitor test circuit for determining a leakage current by measuring different discharge times through two parallel resistors using switches.

FIG. 2 is a circuit diagram 200 of a capacitor test circuit for determining a leakage current by measuring different discharge times through two parallel resistors using switches. This example is similar to that of FIG. 1B, but is performed in a more general manner now that the key nodes and exemplary circuit layouts have been discussed. For example, the transistors are now referred to as switches, since in practice these switches need not be limited to field effect transistors. Bipolar junction transistors, as well as manual switches and virtually any type of IC switch that is fast enough to run through the field tests at a reasonable rate, may be equally suitable. The switches may be discrete and may also be implemented, for example, as a discrete component on a circuit board.

The resistors throughout this disclosure are generally referenced using their symbolic values. One general desire for the resistors is that they match fairly well. Resistors for the purpose of this disclosure can otherwise be discrete components, resistances implemented (e.g., using metals or transistors) in silicon, and virtually any type of device that can function as a resistors that have sufficiently matching properties may be used in connection with this disclosure. In addition, the capacitors used for holdup may be discrete devices. If implemented in a smaller scale in silicon, the capacitors may be appropriately configured transistors, for example.

Referring now to FIG. 2, the supply node may be identified as V_Node. The circuit is modeled with Vin to provide a power source, with C as the capacitor(s), with RL as the parasitic resistance based on the capacitive load, with two parallel resistors R1 and R2, each in series with switches S2 and S3, respectively. V_Node is cut off from Vin by switch S1. Thus, in ordinary operation, the circuits at issue would be powered by Vin at V_Node, with S1 closed. A load resistor may also be present, which may include R1 or R2 for purposes of this example; however, it will be appreciated by those skilled in the art that the load resistor may be found at other places within the circuit. For simplicity and to avoid unduly obscuring the concepts of the disclosure, the regular circuit (e.g., the SSD drives) have been omitted in this illustration, and only a model for the test set-up is shown. Further details of the test operation of the test circuit in FIG. 2 will be described below with similar Figures shown having specific switch states.

Figure 3:
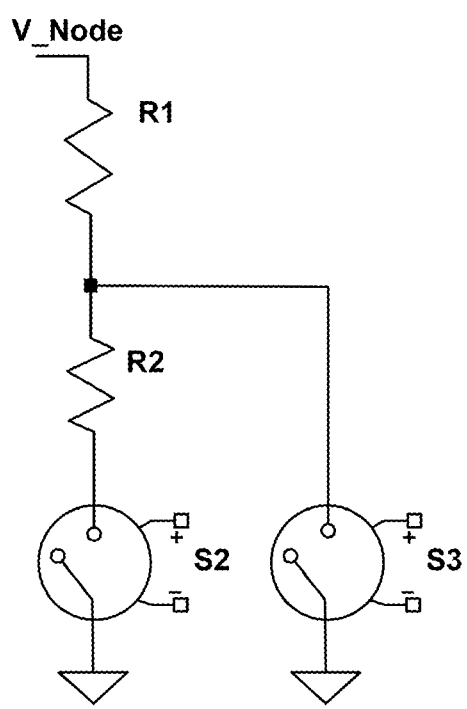
FIG. 3 is an alternative circuit configuration for performing a hold-up capacitor test using discharge times of two resistors in series and a resistor to ground.

FIG. 3 is an alternative circuit configuration 300 for performing a hold-up capacitor test using discharge times of two resistors in series and a resistor to ground. FIG. 3 has a virtually identical operating principle as that as FIG. 2 when the base circuitry (omitted for clarity) is undergoing ordinary operation. That is to say, the circuits exchanging data may be found between the VDD node (here, also identified as V_Node) and the ground, and one or both of R1 and R2 may be used to provide a similar load resistance as desired. A key difference between FIGS. 2 and 3 is the positioning of the resistors R1 and R2, and the state of the switches S2 and S3. By way of example, referring back to FIG. 2, when discharging R1 from a voltage at V_Node, S2 is closed while S3 remains open, and vice versa for discharging R2 (S3 is closed while S2 remains open).

As discussed below, S1 also remains open during discharging periods. Referring back to FIG. 3, the two discharge nodes that will be used for the test are (1) discharge of R1 to ground, and (2) discharge of the serial combination of R1 and R2 to ground. To achieve the former, S2 is open and S3 is closed. In this event, R1 will bypass R2 and discharge directly to ground due to the closed circuit at S3. Conversely, with S3 open and S2 closed, V_Node or the charged capacitor will see the resistive path as the serial combination of R1 and R2 (in addition to the RL parasitic path). Thus R1 and R2 can be used in FIG. 3 for one discharging event, and R1 by itself can be used for the other discharging event. These tests are discussed in further detail below.

Figure 4:
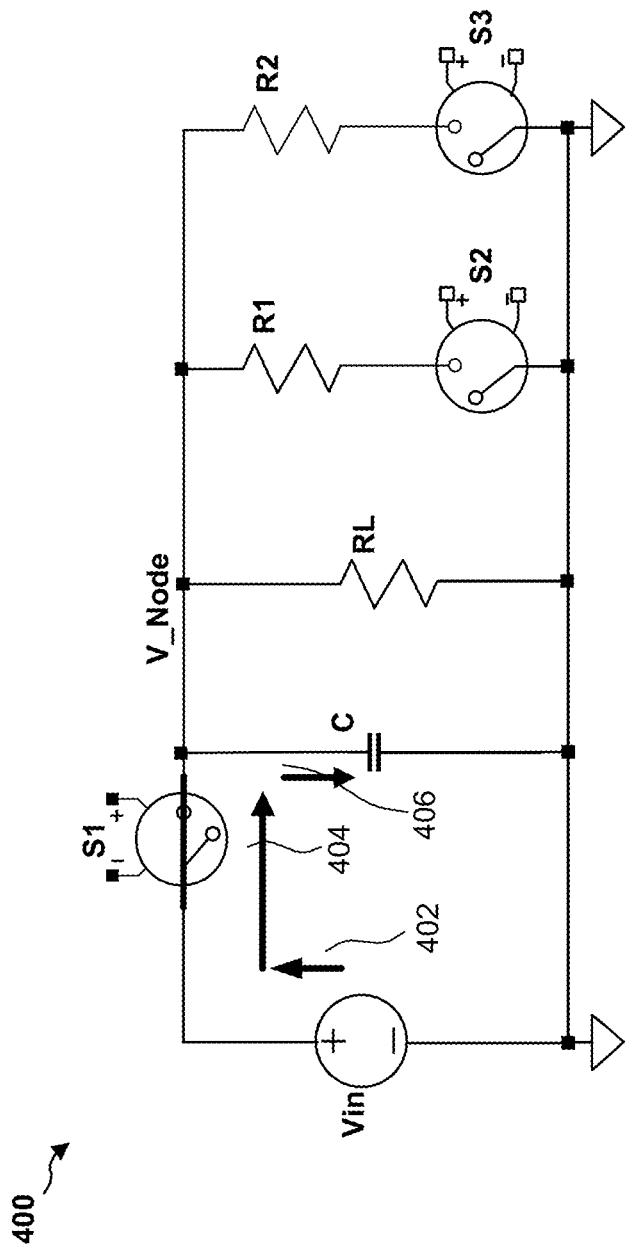
FIG. 4 is a circuit diagram illustrating the charging of the hold-up capacitor to a first voltage using switches.

FIG. 4 is a circuit diagram 400 illustrating the charging of the hold-up capacitor C to first voltage V_Node using switches. The configuration of FIG. 4 is the same as that of FIG. 2, with the exception being the configuration of the switches and the state of the test being illustrated. It is assumed that firmware of the circuit has temporarily suspended certain circuits from operation during the testing, although this is not necessarily required, e.g., where the discharges are minor or where a substitute node is made available to provide an alternate power source, for example. For charging the capacitor, while any voltage may be used, in an embodiment the upper rail or V1=VDD may be chosen for simplicity. It is also assumed that immediately before the test, all three switches are open. The firmware may commence the test by charging C (e.g., using controller 114 of FIG. 1B or other means). The V_Node may be charged to voltage V1 by closing S1 with S2 and S3 open. When S1 closes, the voltage source Vin causes a current to flow through capacitor/capacitor bank C (and less so, through the generally high $R_L$ value), as shown by arrows 402, 404, and 406.

Figure 5:
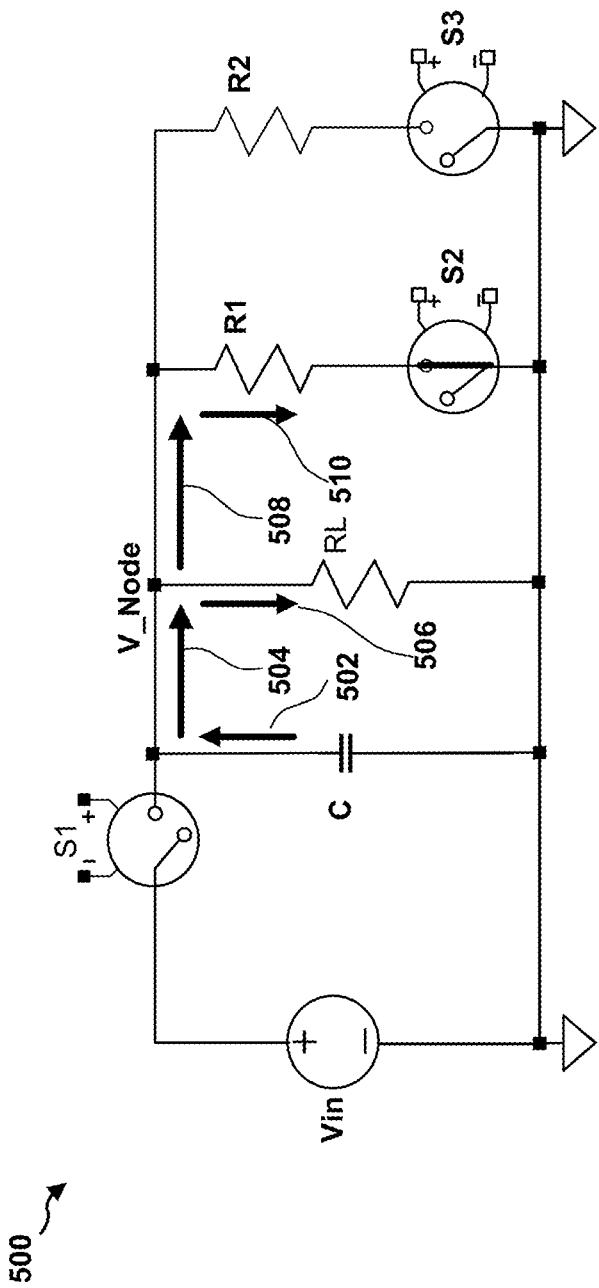
FIG. 5 is a circuit diagram illustrating the discharging of the hold-up capacitor through a first resistor and a leakage resistance using the switches.

FIG. 5 is a circuit diagram 500 illustrating the discharging of the hold-up capacitor C through a first resistor R1 and a leakage resistance $R_L$ using the switches. Now that the capacitor has been charged to V1 in FIG. 4, the first part of the test in FIG. 5 is to discharge that voltage V1 through a first resistance value (as well as RL) and identify the discharge time that it takes for C to discharge to a second specified voltage, i.e., V2. In the example of FIG. 5, V_Node as usual corresponds to the supply node VDD. In the prior configuration of FIG. 4, the switches were positioned such that S1 was closed, and S2 and S3 were open. This enabled C to charge to the predetermined value V1 (e.g., VDD). In FIG. 5, the controller opens S1 and S3 and closes S2. This configuration in turn closes off V_Node from the power supply while providing a current path through R1. The discharge of current through the parasitic resistance RL is shown in FIG. 5 by arrows 502, 504 and 506, which represents the current path through $R_L$. The discharge of current through R1 is shown by the arrows 502, 504, 508 and 510, which in turn represents the current path through R1. The discharge continues until the voltage at V_Node reaches the predetermined voltage V2. The voltage on V_Node may be monitored by the controller 114, for example, or other controller that may record the discharge time (T1) corresponding to the time of discharge from V1 to V2 at V_Node. Thus, at this time, the controller has in its possession the values of V1, V2, C, R1, R2 and T1.

The next desired operation of the circuit 500 is to recharge V_Node to the value V1 (i.e., the same value used in the previous steps), and then discharge V1 through another resistive path to determine a second discharge time, T2. To accomplish this, reference is made once again to FIG. 4 where the circuit 400 showed the initial charging of C to the voltage V1. Here again, the capacitor(s), which have lost energy due to the first discharge, are recharged to V1. For example, the controller may open S2. S3 was already opened in the last discharge step (FIG. 5), so that now both S2 and S3 are open. The controller may close S1. Once again, the presence of Vin at V_Node causes a current to flow through the capacitor, and the controller allows the charging to continue until V_Node=V1.

Figure 6:
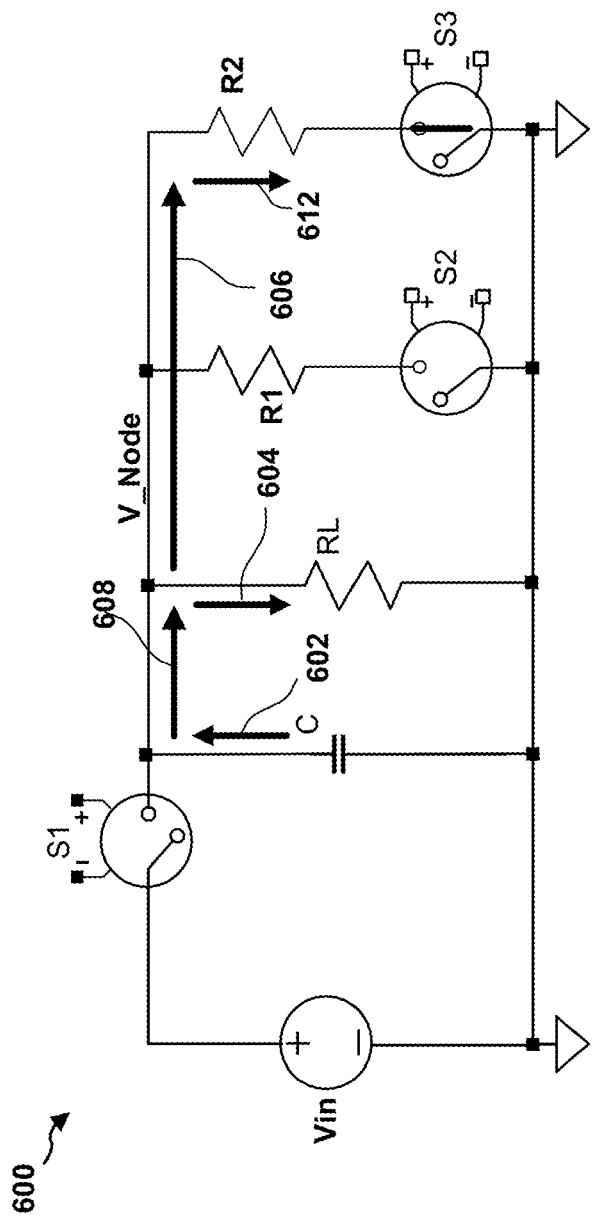
FIG. 6 is a circuit diagram illustrating the discharging of the hold-up capacitor through a second resistor and the leakage resistance using the switches.

FIG. 6 is a circuit diagram illustrating the discharging of the hold-up capacitor through a second resistor and the leakage resistance using the switches. Continuing with the example of FIG. 4 above, V_Node in FIG. 6 is again at the value V1. The controller is now ready to perform the second discharge at V_Node from voltages V1 down to V2, now using the resistance R2 to perform the discharge. The controller may open S1, leaving S2 open, while closing S3. The current from C discharges in part through RL, but mainly through R2. The controller monitors the voltage at V_Node and opens S3 as soon as V_Node reduces to exactly V2. The controller identifies the discharge time T2 of the discharge through resistor R2.

At this point, the controller has the discharge times, T1 and T2, the resistance values corresponding to the discharges R1 and R2, and the voltage values V1 and V2 which it determined at the beginning. The controller can now perform the necessary calculations to identify the parasitic resistance RL and the leakage current. In addition, the controller can independently validate the discharge times to ensure that the calculation match with the measured values.

The controller first can now verify its measurement of the discharge time by calculating the discharge time ($T_1$) of a capacitor (C) into a load ($R_1$), from voltage $V_1$ to $V_2$ with the following equation (i):

$$T_1 = R_1 * C * \ln\left(\frac{V_1}{V_2}\right)$$

The controller can thereafter make the same calculation using the other resistor R2 and identical voltage range and capacitance to confirm the second discharge time T2, using the following equation (ii):

$$T_2 = R_2 * C * \ln\left(\frac{V_1}{V_2}\right)$$

Since the product of the capacitance and the natural log of the voltage ration are identical in both equations, the first equation can be divided by the second equation to arrive the ratio of the discharge times and load resistances, or at equation (iii):

$$\frac{T_1}{T_2} = \frac{R_1}{R_2}$$

Because the capacitors have leakage, the loads have an equivalent resistor ($R_L$) in parallel with them. $R_1$ is actually $$\frac{R_1 * RL}{R_1 + RL}$$

And $R_2$ is actually $$\frac{R_2 * RL}{R_2 + RL}$$

Thus we get $$\frac{T_1}{T_2} = \frac{R_1 * RL * (R_2 + RL)}{R_2 * RL * (R_1 + RL)}$$

With some arithmetic manipulation we end up with—eqn (iv):

$$RL = (R2*((T1/T2)-1))/(1-((T1*R2)/(T2*R1))) \qquad (iv)$$

The discharge times T1 and T2 from the simulation can be applied to equation (iv) to arrive at the parasitic or leakage resistance due to capacitors C. Accordingly, with test times of two known resistive loads the parasitic resistance of the capacitors C can be determined. It is a straightforward manner to use ohm's law to determine the leakage current $i_L$ through the parasitic resistance. Once the leakage current is known, it can be taken into account to determine whether the energy threshold at V_Node is sufficient to preserve the integrity of the data in a power outage event.

As an example, the following values are possible.

C=500 uF $R_1$=8.869K (9.1K (2 each 18.2KΩ in parallel) in parallel with 350KΩ in the feedback network)

$R_2$=4.435K (4.55K (4 each 18.2KΩ in parallel) in parallel with 350K)

$R_L$=27.3K (gives an average of 1 mA over the 95% discharge range of 28V to 26.6V)

Based on the above values, a simulation can then be run as described in this disclosure to identify T1 and T1. Having obtained T1 and T2, we can use equation (iv) to compute the leakage resistance. As such, with test times of two known resistive loads determined based on simulation, the leakage resistance can be determined. The ohm's law can provide the leakage current $i_L$.

Figure 7:
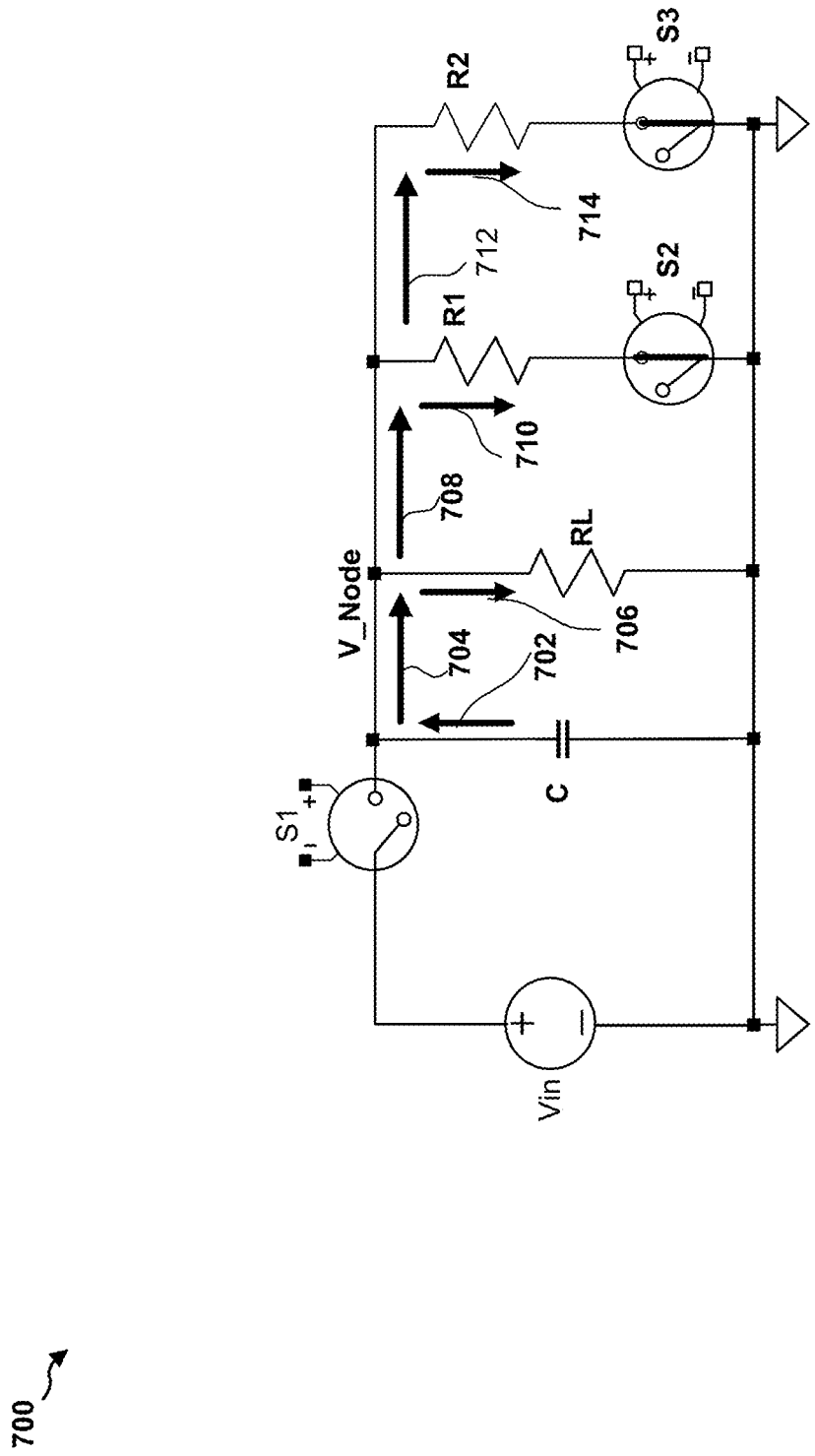
FIG. 7 is a circuit diagram illustrating the discharging of the hold-up capacitor through the first and the second resistors in parallel and the leakage resistance using the switches.

FIG. 7 is a circuit diagram 700 illustrating the discharging of the hold-up capacitor through the first and the second resistors in parallel and the leakage resistance using the switches. FIG. 7 shows an alternative embodiment to the embodiment described in FIGS. 4-6. In FIG. 7, the charging and recharging of C to V1 is the same as in FIG. 4. Further, in FIG. 7, the initial use of R1 as a first resistive discharge path is also the same as in FIG. 5. However, instead of using R2 as the second resistance in this embodiment, the parallel combination of R1 and R2 is used as the second resistance. Accordingly, the capacitor (bank) is initially charged to a first value V1, as in FIG. 4. Thereafter, S1 and S3 are opened and the first discharge occurs through R1 as in FIG. 5. After the first discharge is complete and the discharge time T1 is measured by the controller, the controller then closes S1 and opens S2 and S3 to recharge the capacitor C back to the value V1. Next, in FIG. 7, S1 is again opened but this time the controller simultaneously closes both S2 and S3. The capacitor is then discharged again, this time through the parallel combination of R1 and R2. That is, the capacitor discharges through arrows 702, 704 and 706 in a first branch, 702, 704, 708, and 710 in a second branch (R1), and 702, 704, 708, 712 and 714 in a third branch (R2). The measured discharge time T2 to reach the specified voltage V2 can be assumed to be shorter since the net resistance is lower and the current can flow through both paths.

Following the discharge time measurements T1 and T2 taken by the controller with reference to the embodiment of FIG. 7, the same calculation including equations (i)-(iv) are applicable to determine RL, this time only using $$R1 \| R2 = \frac{R1 R2}{R1 + R2}$$

as the second resistance value. FIG. 7 demonstrates that a number of variations of the resistance values are possible and accomplish the same goals without departing from the spirit and scope of the present disclosure.

Figure 8:
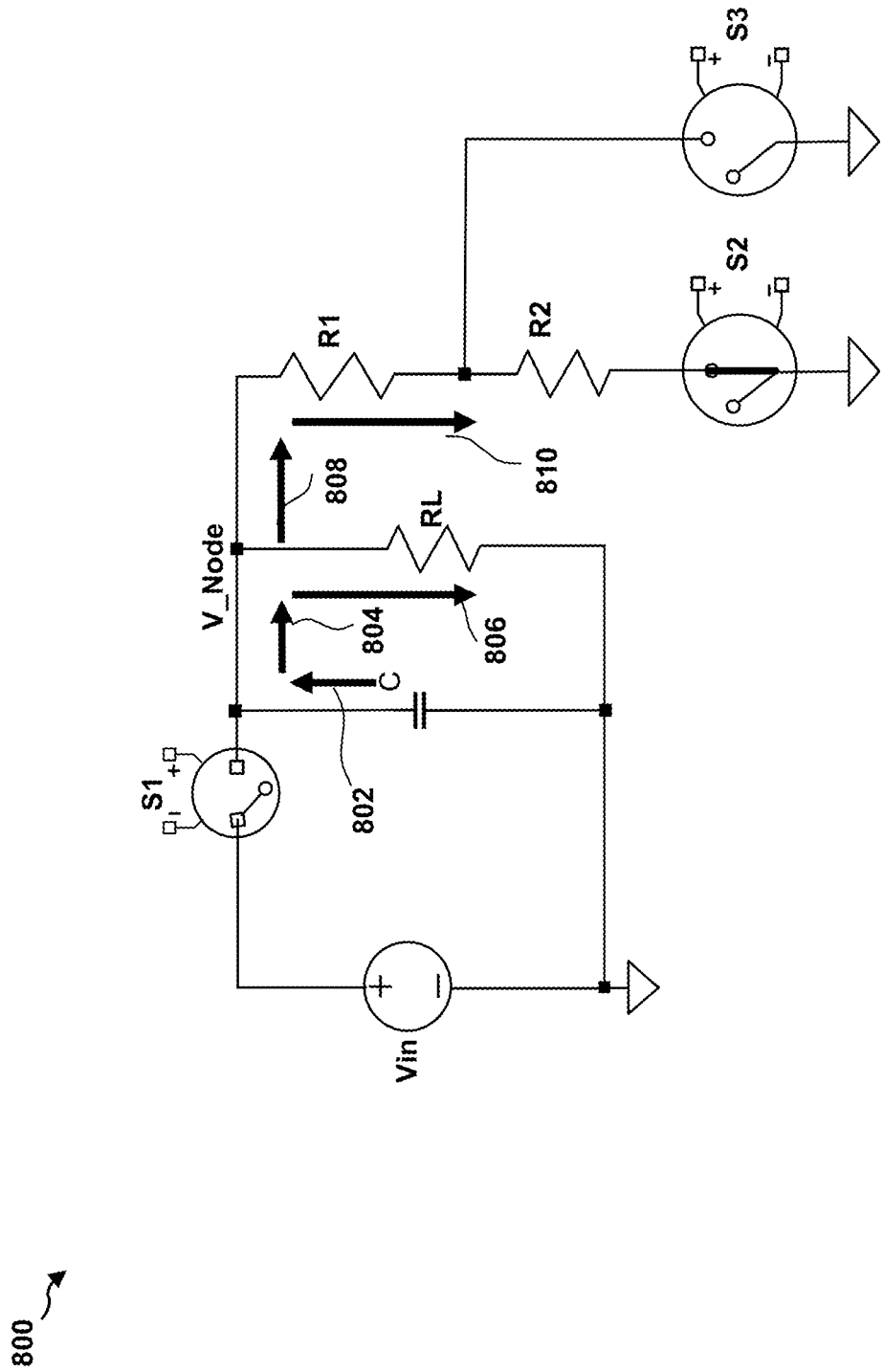
FIG. 8 is a circuit diagram illustrating the discharging of the hold-up capacitor through two resistors in series and the leakage resistance using switches.

FIG. 8 is a circuit diagram 800 illustrating the discharging of the hold-up capacitor through two resistors in series and the leakage resistance using switches. As discussed above, the measurement in the case of FIG. 8 involves the use of the serial combination of R1+R2 as the first resistance (with the controller having S3 open and S2 closed) and R1 as the second resistance (with the controller having S2 open and S3 closed). It is assumed for the purposes of the embodiment in FIG. 8 that the capacitor C has been pre-charged to a voltage V_Node=V1 in the usual manner, namely that the controller opened S2 and S3 and closed S1 to charge the capacitor. Next, FIG. 8 shows the first discharge of the capacitor. The controller opens S1 and closes S2 (with S3 remaining open) and measures the discharge time at V_Node for the voltage to be reduced to V2 from V1. It should be noted that as is true of earlier cases, the parasitic or leakage resistance RL represents a resistive path from V_Node to ground, and thus some current flows through RL during each discharge period. That is, as shown by the arrows 802, 804 and 806, a portion of the current flows through C's parasitic resistance RL. The main portion of the current flows through arrows 802, 804, 808 and 810 and through R1 and R2. The case of FIG. 8, where the capacitor discharges through the larger resistance value of R1+R2 is also known as a light load.

Figure 9:
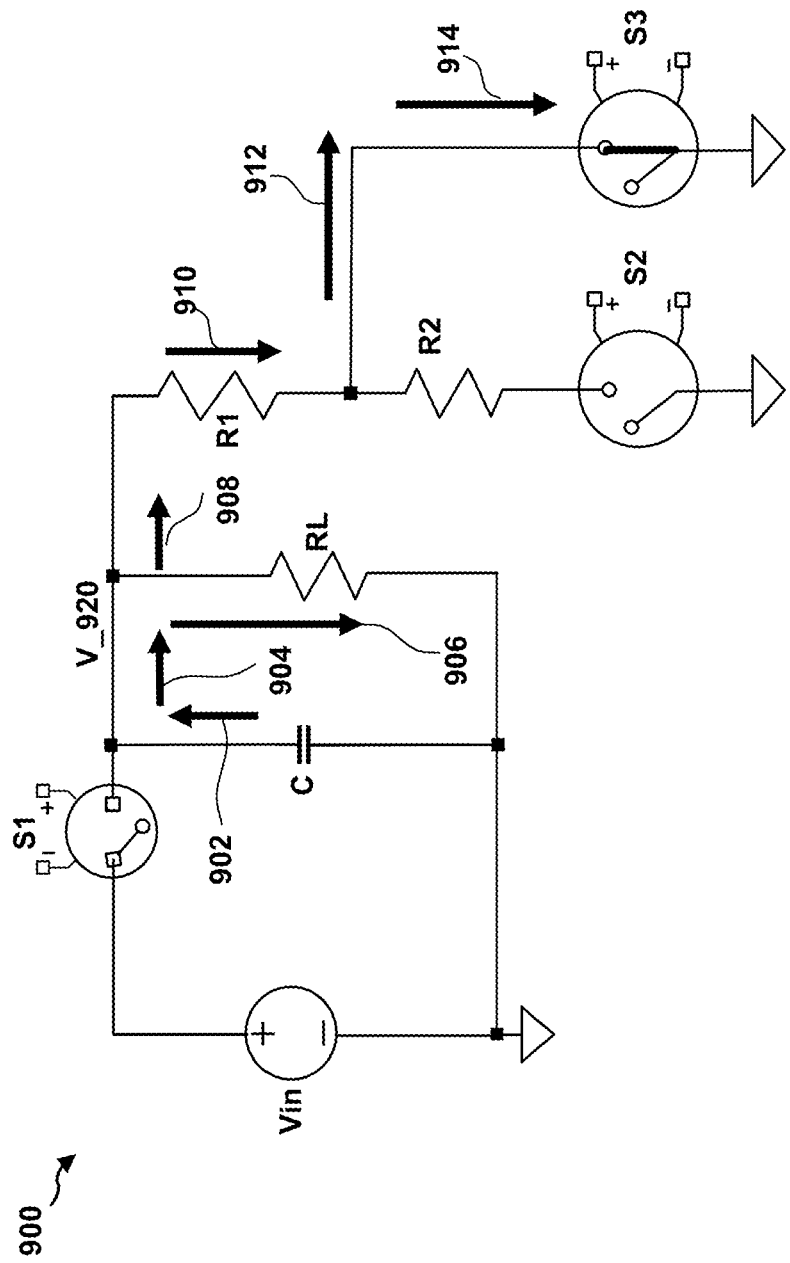
FIG. 9 is a circuit diagram illustrating the discharging of the hold-up capacitor though the first resistor and the leakage resistance using the switches of FIG. 8.

FIG. 9 is a circuit diagram 900 illustrating the second discharging of the hold-up capacitor though the first resistor and the leakage resistance using the switches of FIG. 8. The recharge step occurs first to enable the controller to allow Vin (or the equivalent power supply) to charge the capacitor C (which as usual can be a plurality of capacitors between V_Node and ground) to V1. Thereafter, as shown in FIG. 9, the controller opens S2 which disconnects R2 from ground. The discharging current flows via arrows 902, 904 and 906 through RL as usual, and also via 902, 904, 908, 910, 912 and 914 through R1. As before, the controller measures the time taken for the circuit to discharge from V1 to V2. The embodiment of FIG. 9 is considered a heavy load. In short, the controller uses the serial combination of R1 and R2 as the resistance to measure T1 in FIG. 8, and the controller uses R1 as the resistance to measure T2 in FIG. 9.

The controller, as before, can also calculate the discharge time ($T_1$) of capacitor (C) into a load ($R_a$), from voltage $V_1$ to $V_2$ with the following equation:

$$T1 = Ra * C * \ln\left(\frac{V1}{V2}\right)$$

Next, the controller can make the same calculation using a different load ($R_b$) over the same range to obtain:

$$T2 = Rb * C * \ln\left(\frac{V1}{V2}\right)$$

The controller can take the ratio to arrive at:

$$\frac{T1}{T2} = \frac{Ra}{Rb}$$

As in the previous embodiment, The capacitors have leakage, and consequently the loads have an equivalent resistor ($R_L$) in parallel with them.

$R_a$ is actually $$\frac{Ra * RL}{Ra + RL}$$

$R_b$ is actually $$\frac{Rb * RL}{Rb + RL}$$

In this case Ra is $R_1+R_2$ and Rb is $R_1$. Thus the ratio of discharge times is:

$$\frac{T1}{T2} = \frac{(R1+R2)*RL*(R1+RL)}{(R1+R2+RL)*(R1*RL)}$$

Again, with arithmetic manipulation, the following expression can be obtained:

$$RL = \Delta T*(R_1^2*R_2+R_1*R_2^2)/(T_2*R_2^2-\Delta T*R_1*R_2),$$

where $\Delta T = T_1-T_2$

If $R_1=R_2=R$ then this equation simplifies to $$RL = (\Delta T*2*R)/(T_2-\Delta T)$$

In summary, with test times of two known resistive loads identified through simulation, the leakage resistance can be determined, and a straightforward application of ohm's law allows the controller to obtain the leakage current.

In another embodiment, it is possible to perform the hold-up test using only one external load. For example, the leakage of the capacitor can be isolated as the first load and the external load can be used as the second load. The mathematics become simpler, but, since the natural leakage of the capacitor is low, or stated differently, the equivalent resistance is very high, test duration will be comparatively long. Since the increased test time with the natural leakage raises a greater likelihood of a power failure occurring during that time (and the capacitor having less than full charge), this configuration is best used for systems that have a limited number of tests or for circuit configurations with potentially less urgent consequences.

Figure 10:
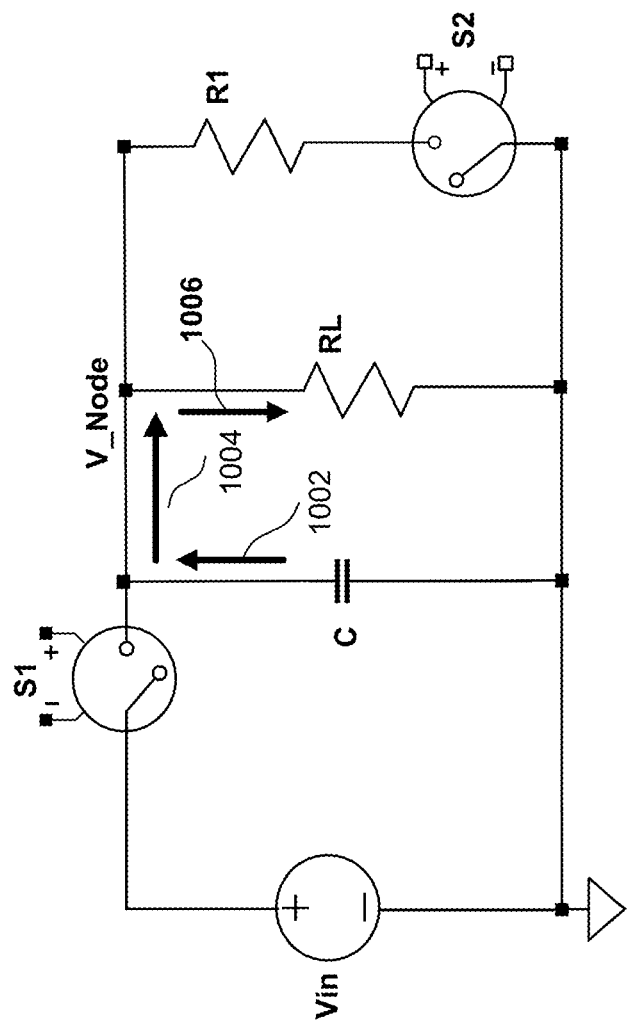
FIG. 10 is a circuit diagram illustrating the discharging of the hold-up capacitor through the leakage resistance.

An example of this embodiment is shown in FIG. 10. FIG. 10 is a circuit diagram 1000 illustrating the discharging of the hold-up capacitor through the leakage resistance using switches. As usual, the supply node V_Node is charged to a first voltage V1. Both switches S1 and S2 are opened, and the time for the capacitor to discharge though RL to a second voltage is measured. The current discharge path traverses directly from 1002 through 1004 and the leakage resistance path 1006.

Figure 11:
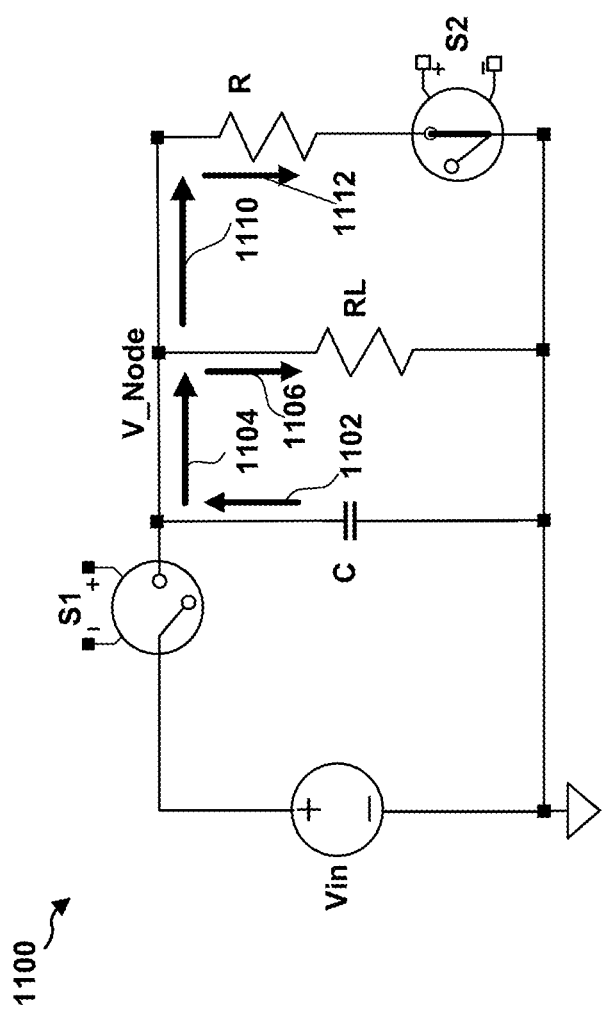
FIG. 11 is a circuit diagram illustrating the discharging of the hold-up capacitor through the load resistor and the leakage resistance using switches.

FIG. 11 is a circuit diagram 1100 illustrating the discharging of the hold-up capacitor through the load resistor and the leakage resistance using switches. As per other cases, V_Node is recharged by opening S2 and closing S1. Then S1 is opened and S2 is closed, and T2 is measured after the capacitor discharges to V2. When S2 is closed, in addition to discharging through RL as described above, R discharges via path 1102, 1104, 1110 and 1112 and the time for both RL and R to discharge from V1 to V2 can also be measured.

The controller 112 can calculate the discharge time (T1) of a capacitor (C) into a load ($R_a$), from voltage $V_1$ to $V_2$ with the following equation:

$$T1 = Ra*C*\ln\left(\frac{V1}{V2}\right)$$

If the controller 112 makes the same measurement using a different load ($R_b$) over the same range, the result is $$T2 = Rb*C*\ln\left(\frac{V1}{V2}\right)$$

If the controller takes the ratio, then the result is $$\frac{T1}{T2} = \frac{Ra}{Rb}$$

Because the capacitors have leakage, the load has an equivalent resistor ($R_L$) in parallel with it. If we let the leakage be the first load then Ra is only RL as illustrated in FIG. 10. And, as shown in the circuit of FIG. 22, $R_b$ is $$\frac{Rb*RL}{Rb+RL}$$

In this case Ra is $R_L$ and Rb is just R. Thus the equation reduces to the following:

$$\frac{T1}{T2} = \frac{RL*(R+RL)}{(R*RL)}$$

The controller can thereupon use the measured values to determine the leakage or parasitic resistance.

Figure 12:
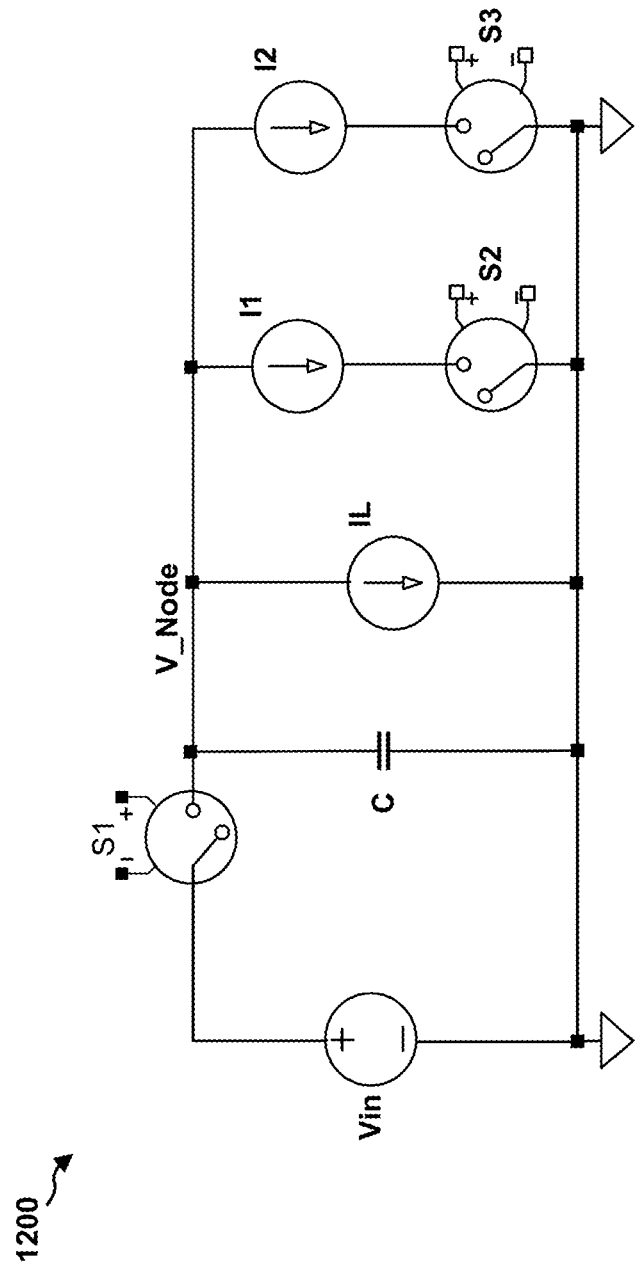
FIG. 12 is a circuit diagram illustrating a circuit for testing a hold-up capacitor using a pair of current sinks in parallel and in series with one switch each.

In another aspect of the disclosure, in lieu of resistors as loads, the test can implement current loads or sinks. An example of this configuration is shown in FIG. 12. FIG. 12 is a circuit diagram 1200 illustrating a circuit for testing a hold-up capacitor using a pair of current sinks in parallel and in series with one switch each. The current sinks may be physically implemented using any known technique. For example, the current sinks may be a discrete integrated circuits, for example, or a custom set of designed components. In other configurations, the current sinks may be generated in silicon using CMOS, e.g., with an operational amplifier with an output in a feedback loop and one or more current mirrors, etc. Current sinks may also be implemented using bipolar junction transistors. In cases where high currents are involved, the current sinks will likely be implemented as discrete devices.

Referring now to FIG. 12, an identical input stage is shown with Vin, S1 and a supply node V_Node. The test circuit 1200 is shown with the capacitor C (which can be plural capacitors as previously noted), and in this embodiment, with two current sinks i1 and i2 implemented in parallel and having a switch each, S2 and S3, in serial with each respective current sink i2 and i2. The capacitor may be charged and discharged as per earlier embodiments—namely, the controller closes S1 and keeps S2 and S3 open to charge C to its V1 value. During a first discharge, S2 is closed (with S1 and S3 open) and the discharge time T1 for V_Node to reach V2 is measured. After the recharge of V_Node back to V1, the process is repeated to obtain T2 when V2 is reached for I2.

In summary for the constant current loads, Voltage source Vin charges capacitor C to voltage $V_1$ when switch S1 is closed and switches S2 and S3 are open. The normal capacitor leakage is represented by current sink $I_L$. The capacitor C is discharged to $V_2$ with $I_1$ by opening S1 and closing S2. The discharge time from $V_1$ to $V_2$ ($\Delta V$) is saved as $T_1$ ($\Delta T_1$). The capacitor is recharged to $V_1$ by opening S2 and closing S1. The capacitor is discharged to $V_2$ with $I_2$ by opening S1 and closing S3. The discharge time from $V_1$ to $V_2$ ($\Delta V$) is saved as $T_2$ ($\Delta T_2$). It should also be noted that, as before, a second load may be to configure both switches (S1 and S2) to close simultaneously.

The current (I) through a capacitor (C) with a voltage changing at a rate of ΔV/ΔT is given below.

$$I_1 = C*(\Delta V/\Delta T_1)$$

If the measurement is made with a second load over the same voltage range, the result is:

$$I_2 = C*(\Delta V/\Delta T_2)$$

If the ratio of the measurements are taken, the deltas can be eliminated as follows:

$$\frac{I1}{I2} = \frac{T2}{T1}$$

Because the capacitor has leakage, the loads have an equivalent load (IL) in parallel with them. For example, $I_1$ is actually $$I1+IL$$

and $I_2$ is actually $$I2+IL$$

Thus with this change: $(I_1+I_L)/(I_2+I_L)=T_2/T_1$

As usual, with some arithmetic manipulation, the result becomes $$(I2*T2-I1*T1)/(T1-T2)$$

As an example, using the following numerical values the controller can make the following calculations and then use the obtained test times to calculate the unknown leakage current.

For C=1000 uF
$I_1$=50 mA
$I_2$=100 mA
$I_L$=5 mA

In short, with test times from two known constant current loads we can determine the unknown leakage current. Discharging from 28V to 26.6V:
The simulation shows:
$T_1$=25.45 mS
$T_2$=13.33 mS
If we plug those results into our equation we get
$I_L$=4.9917 mA Since the currents are strictly additive, another combination of loads, $I_1+I_2$ for example, could be used and its value just substituted for the value for $I_2$ above.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A circuit, comprising:
   a capacitor between a voltage line and ground and having a parasitic resistance;
   first and second resistors between the voltage line and first and second respective switches to the ground; and
   a controller configured to charge the voltage line to a first voltage, to discharge the first voltage to a second voltage via the first resistor during a first identified time, to discharge the first voltage to the second voltage via at least the second resistor during a second identified time, and to determine the parasitic resistance using the first and second identified times.

2. The circuit of claim 1, wherein the controller is further configured to determine a leakage current through the capacitor based on the parasitic resistance.

3. The circuit of claim 2, wherein the controller is further configured to determine whether the capacitor maintains a specified energy for at least a power-off discharge time determined based on the leakage current.

4. The circuit of claim 3, wherein the controller is further configured to provide a pass indication when the capacitor maintains the specified energy for at least the power-off discharge time, and a fail indication otherwise.

5. The circuit of claim 1, wherein the controller is further configured to:
   perform the discharge via the first resistor when the first switch is closed and the second switch is open; and
   perform the discharge via the second resistor when the first switch is open the second switch is closed.

6. The circuit of claim 1, wherein the controller comprises a voltage source configured to charge the voltage line to the first voltage to enable the discharge via the first resistor and to recharge the voltage line to the first voltage to enable the discharge via the second resistor.

7. The circuit of claim 6, wherein
   the voltage source is coupled to the voltage line via a third switch; and
   the controller is configured to charge the voltage line to the first voltage when the third switch is closed and the first and second switches are open.

8. The circuit of claim 1, wherein the at least the second resistor comprises a parallel combination of the first and second resistors.

9. A circuit, comprising:
   a capacitor between a voltage line and ground and having a parasitic resistance;
   a first resistor between the voltage line and a first switch to the ground;
   a second resistor between the first switch and a second switch to the ground; and
   a controller coupled to the voltage line and configured to charge the voltage line to a first voltage, discharge the first voltage to a second voltage via the first resistor during a first identified time, discharge the first voltage to the second voltage via the first and second resistors during a second identified time, and determine the parasitic resistance using the first and second identified times.

10. The circuit of claim 9, wherein the controller is further configured to determine a leakage current through the capacitor based on the parasitic resistance.

11. The circuit of claim 9, wherein the controller is further configured to:
perform the discharge via the first resistor when the first switch is closed and the second switch is open; and
perform the discharge via the first and second resistors when the first switch is open the second switch is closed.

12. The circuit of claim 9, wherein the controller comprises a voltage source configured to (1) charge the voltage line to the first voltage to enable the discharge via the first resistor and to (2) recharge the voltage line to the first voltage to enable the discharge via the first and second resistors.

13. The circuit of claim 12, wherein
the voltage source is coupled to the voltage line via a third switch; and
the controller is configured to charge the voltage line to the first voltage when the third switch is closed and the first and second switches are open.

14. The circuit of claim 9, wherein the capacitor comprises a bank of two or more capacitors organized between the voltage line and ground in one or both of in series and in parallel, a net parasitic resistance of the bank comprising the parasitic resistance.

15. The circuit of claim 9, wherein the resistors comprises one or more transistors in silicon or as discrete elements.

16. A circuit, comprising:
a capacitor between a voltage line and ground and having a parasitic current sink ($pi_s$);
first and second current sinks ($i_s$) between the voltage line and first and second respective switches to the ground; and
a controller configured to charge the voltage line to a first voltage, to discharge the first voltage to a second voltage via the first is during a first identified time, to discharge the first voltage to the second voltage via at least the second $i_s$ during a second identified time, and to determine a current through $pi_s$ the using the first and second identified times.

17. The circuit of claim 16, wherein the controller is coupled to the voltage line via a third switch.

18. The circuit of claim 17, wherein the controller is further configured to:
charge and recharge the voltage line to the first voltage when the third switch is closed and the first and second switches are open;
discharge the voltage line via the first $i_s$ when the second and third switches are open and the first switch is closed; and
discharge the voltage line via at least the second $i_s$ when at least the third switch is open and one or both of the second switch, or the first and second switches, are closed.

19. The circuit of claim 16, wherein the switches comprise field effect transistors (FETs).

20. The circuit of claim 16, wherein the controller is further configured to determine whether a specified amount of energy is retained on the voltage line for at least a discharge time determined using the determined current through $pi_s$.

* * * * *